(12) United States Patent
Matsuzaki et al.

(10) Patent No.: US 9,368,406 B2
(45) Date of Patent: Jun. 14, 2016

(54) METHOD FOR MANUFACTURING SEMICONDUCTOR CHIP

(71) Applicant: FUJI XEROX CO., LTD., Tokyo (JP)

(72) Inventors: Hirokazu Matsuzaki, Kanagawa (JP); Kenji Yamazaki, Kanagawa (JP); Michiaki Murata, Kanagawa (JP); Takahiro Hashimoto, Kanagawa (JP); Takeshi Minamiru, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 14/817,873

(22) Filed: Aug. 4, 2015

(65) Prior Publication Data

US 2016/0099176 A1 Apr. 7, 2016

(30) Foreign Application Priority Data

Oct. 2, 2014 (JP) .................................. 2014-203547

(51) Int. Cl.
| | |
|---|---|
| H01L 21/78 | (2006.01) |
| H01L 21/304 | (2006.01) |
| H01L 21/02 | (2006.01) |
| H01L 21/683 | (2006.01) |

(52) U.S. Cl.
CPC .......... *H01L 21/78* (2013.01); *H01L 21/02057* (2013.01); *H01L 21/3043* (2013.01); *H01L 21/6836* (2013.01)

(58) Field of Classification Search
None
See application file for complete search history.

(56) References Cited

U.S. PATENT DOCUMENTS

| | | | |
|---|---|---|---|
| 9,224,650 B2 * | 12/2015 | Lei | ........................ H01L 21/78 |
| 2016/0042996 A1 * | 2/2016 | Yakoo | .................... H01L 21/78 |
| | | | 438/462 |

FOREIGN PATENT DOCUMENTS

| | | |
|---|---|---|
| JP | 2003-124151 A | 4/2003 |
| JP | 2009-088252 A | 4/2009 |

* cited by examiner

*Primary Examiner* — Scott B Geyer
(74) *Attorney, Agent, or Firm* — Sughrue Mion, PLLC

(57) ABSTRACT

A method for manufacturing a semiconductor chip includes forming a front-side groove in a front surface of a substrate; forming a back-side groove wider than the front-side groove by a rotating cutting member from the back surface of the substrate toward the front-side groove; attaching a holding member having an adhesive layer to the back surface of the substrate after forming the back-side groove; dry-washing the back surface before attaching the holding member to the back surface; extending the distance between adjacent semiconductor chips by expanding the holding member attached to the back surface; and separating the semiconductor chips at the extended distance therebetween from the holding member.

9 Claims, 15 Drawing Sheets

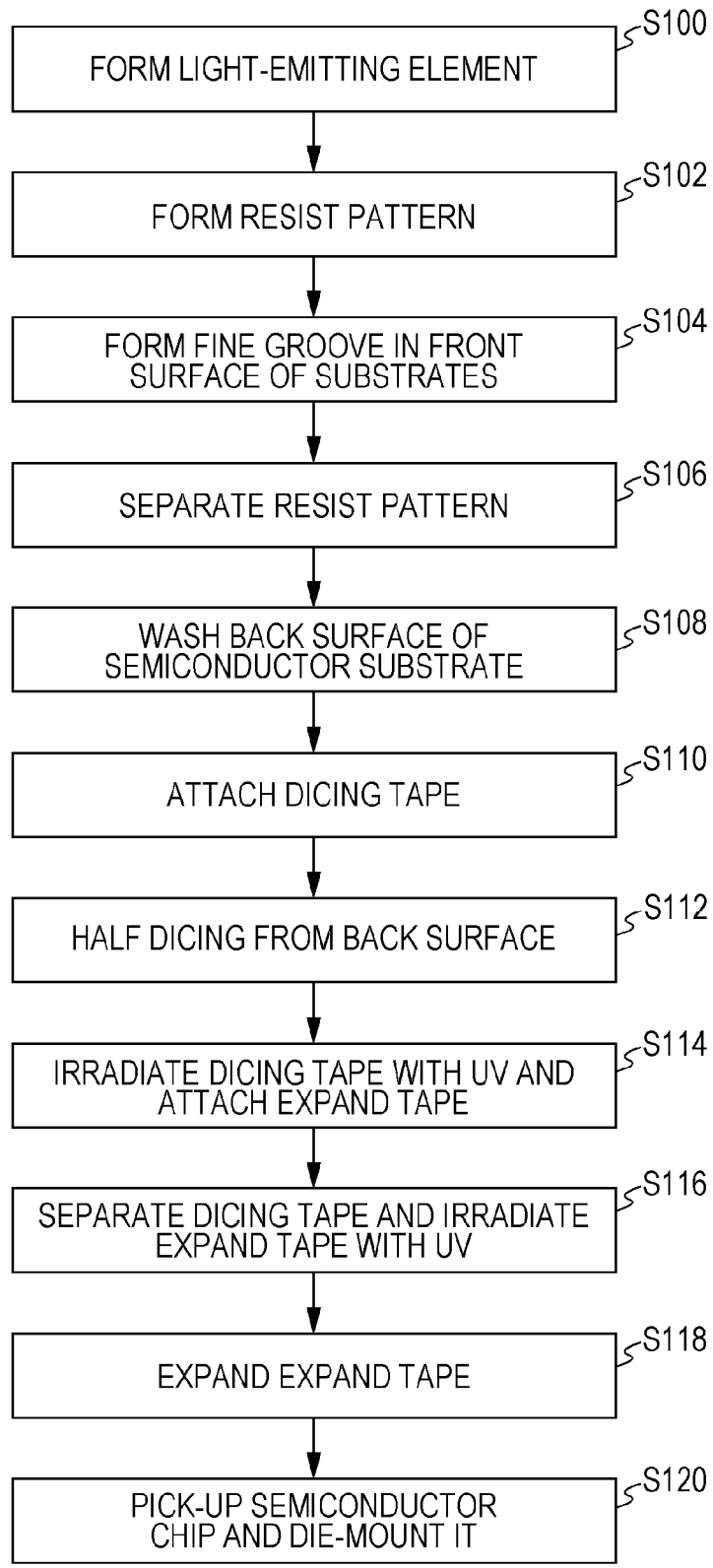

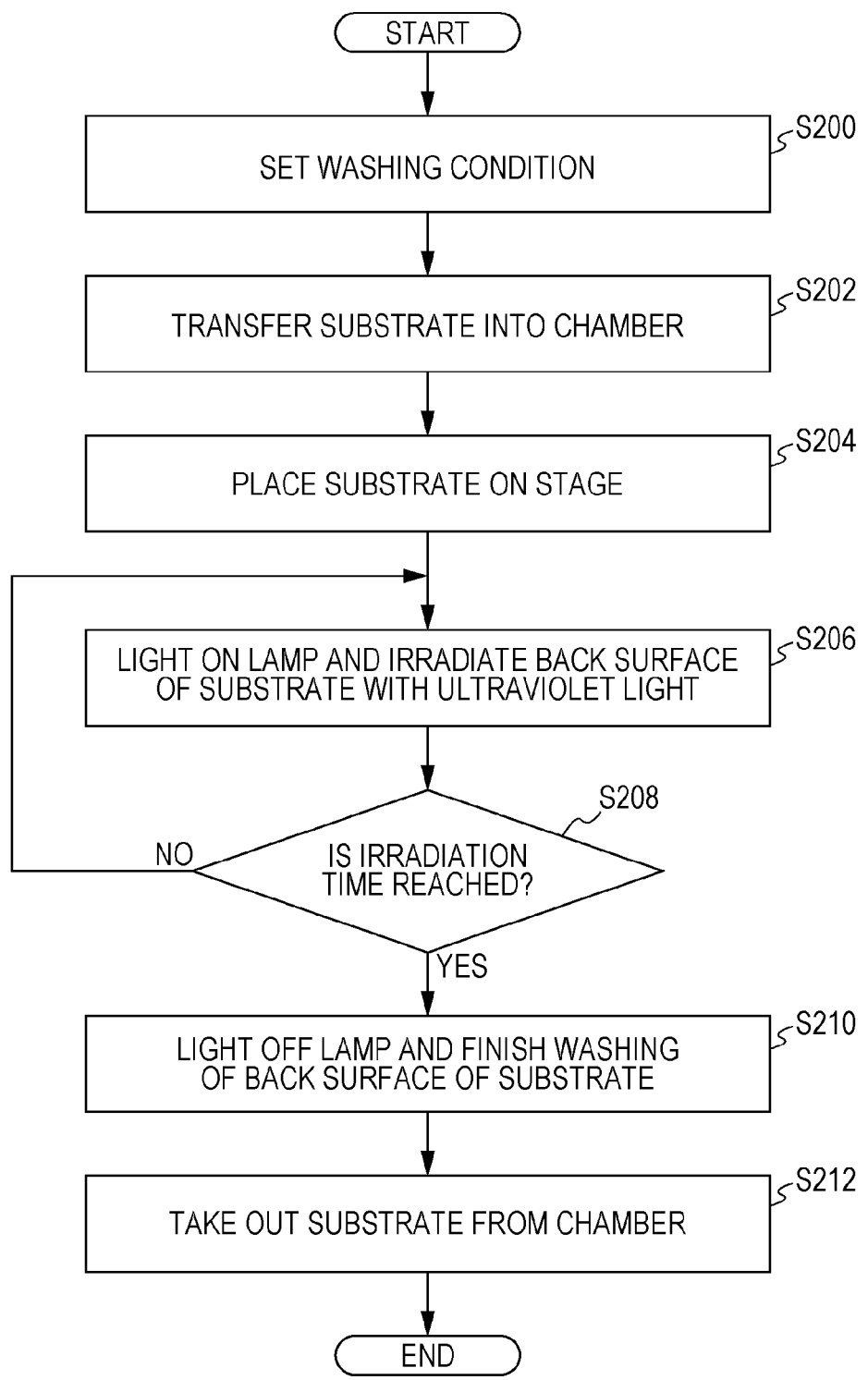

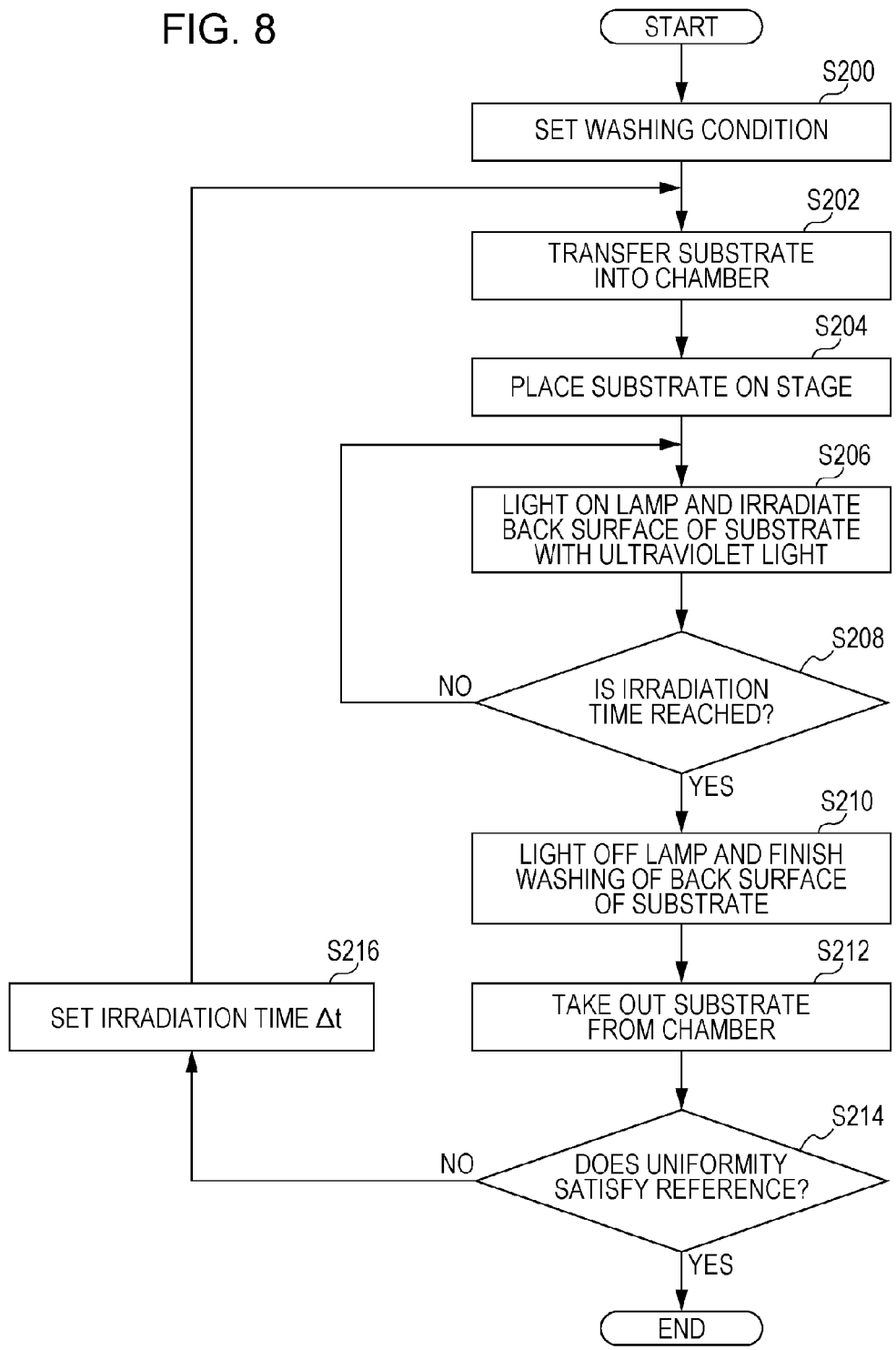

METHOD FOR MANUFACTURING SEMICONDUCTOR CHIP

CROSS-REFERENCE TO RELATED APPLICATIONS

This application is based on and claims priority under 35 USC 119 from Japanese Patent Application No. 2014-203547 filed Oct. 2, 2014.

BACKGROUND (i) Technical Field

The present invention relates to a method for manufacturing a semiconductor chip.

(ii) Related Art

A method known as a method for increasing the number of semiconductor chips which can be obtained from one substrate includes forming front-side grooves in a front surface of a substrate, forming back-side grooves wider than the front-side grooves by a rotating cutting member from the back surface toward the front-side grooves, and then dividing the substrate into individual semiconductor chips.

In the method for manufacturing semiconductor chips, after the back-side grooves are formed, a holding member such as an expand tape is attached to the back surface of the substrate, and the holding member to which the substrate has been attached is expanded to increase the distance between the semiconductor chips so that individual semiconductor chips can be easily picked up by a collet or the like.

In the manufacturing method, low uniformity of adhesion between the substrate and the holding member may cause misregistration of the semiconductor chips in the step of increasing the distance between the adjacent semiconductor chips or a separation defect in the step of separating the semiconductor chips from the holding member.

SUMMARY

According to an aspect of the invention, there is provided a method for manufacturing a semiconductor chip, the method including forming a front-side groove in a front surface of a substrate; forming a back-side groove wider than the front-side groove by a rotating cutting member from the back surface of the substrate toward the front-side groove; attaching a holding member having an adhesive layer to the back surface of the substrate after forming the back-side groove; dry-washing the back surface before attaching the holding member to the back surface; extending the distance between adjacent semiconductor chips by expanding the holding member attached to the back surface; and separating the semiconductor chips at the extended distance therebetween from the holding member.

BRIEF DESCRIPTION OF THE DRAWINGS

Exemplary embodiments of the present invention will be described in detail based on the following figures, wherein:

FIG. 1 is a flow chart showing an example of a process for manufacturing a semiconductor chip according to an exemplary embodiment of the present invention;

FIG. 7 is a flow chart illustrating an UV ozone washing operation according to an exemplary embodiment of the present invention;

FIG. 8 is a flow chart illustrating another operation of UV ozone washing according to an exemplary embodiment of the present invention;

DETAILED DESCRIPTION

Figure 2A:
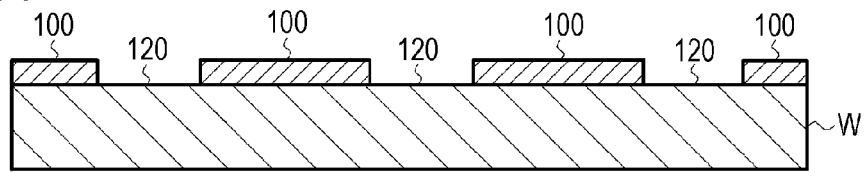
FIGS. 2A to 2E are schematic cross-sectional views of a semiconductor substrate in a process for manufacturing a semiconductor chip according to an exemplary embodiment of the present invention.

A method for manufacturing a semiconductor chip according to an exemplary embodiment of the invention is applied to, for example, a method for manufacturing individual semiconductor chips by dividing, into individual chips, a substrate-shaped member such as a semiconductor wafer on which plural semiconductor elements have been formed. The semiconductor elements formed on the substrate are not particularly limited and include a light-emitting element, an active element, a passive element, and the like. As an example, the manufacturing method according to an exemplary embodiment of the invention is applied to a method for taking out a semiconductor chip including a light-emitting element from a substrate, and the light-emitting element may be a surface-emitting semiconductor laser, a light-emitting diode, or a light-emitting thyristor. A semiconductor chip may include a single light-emitting element or plural light-emitting elements arranged in an array, and a semiconductor chip may further include a drive circuit which drives one or plural light-emitting elements. Also, the substrate may be a substrate of, for example, silicon, SiC, a compound semiconductor, sapphire, or the like. However, the substrate is not limited to this and may be a substrate of another material as long as the substrate contains at least a semiconductor (hereinafter referred to as a generic name "semiconductor substrate"). For example, the substrate is a group III-V compound semiconductor substrate of GaAs or the like on which a light-emitting element such as a surface-emitting semiconductor laser, a light-emitting diode, or the like is formed.

In description below, a method for taking out individual semiconductor chips from the semiconductor substrate on which plural light-emitting elements have been formed is described with reference to the drawings. In addition, it is noted that the scale and shape of each of the drawings are emphasized for facilitating understanding of the characteristics of the invention and are not necessarily the same as the scale and shape of an actual device.

Embodiment

FIG. 1 is a flow chart showing an example of a process for manufacturing semiconductor chips according to an exemplary embodiment of the invention. As shown in FIG. 1, the method for manufacturing semiconductor chips according to the exemplary embodiment includes a step (S100) of forming light-emitting elements, a step (S102) of forming a resist pattern on a front surface of a semiconductor substrate, a step (S104) of forming fine grooves in the front surface of the semiconductor substrate, a step (S106) of separating the resist pattern, a step (S108) of washing the back surface of the semiconductor substrate, a step (S110) of attaching a dicing tape to the front surface of the semiconductor substrate, a step (S112) of half dicing the semiconductor substrate from the back surface, a step (S114) of irradiating the dicing tape with ultraviolet light (UV) and attaching an expand tape to the back surface of the semiconductor substrate, a step (S116) of separating the dicing tape and irradiating the expand tape with ultraviolet light, a step (S118) of expanding the expand tape, and a step (S120) of picking a semiconductor chip and die-mounting the semiconductor chip on a circuit board or the like. Sectional views of a semiconductor substrate shown in FIGS. 2A to 2E and FIGS. 3A to 3E correspond to the respective steps from S100 to S120.

In the step (S100) of forming light-emitting elements, as shown in FIG. 2A, plural light-emitting elements 100 are formed on the front surface of a semiconductor substrate W of GaAs or the like. Each of the light-emitting elements 100 is, for example, a surface-emitting semiconductor laser, a light-emitting diode, a light-emitting thyristor, or the like. In the drawing, a region is shown as each of the light-emitting elements 100, but each of the light-emitting elements 100 is shown as an example of elements included in a divided semiconductor chip. It is noted that the region of each of the light-emitting elements 100 may include not only one light-emitting element but also plural light-emitting elements, another circuit element, and a semiconductor element. In addition, the light-emitting elements are emphasized by being shown to project from the surface of the substrate in order to make the description easy to understand. However, the light-emitting elements 100 may be formed so as to be substantially flush with the surface of the substrate.

Figure 4:
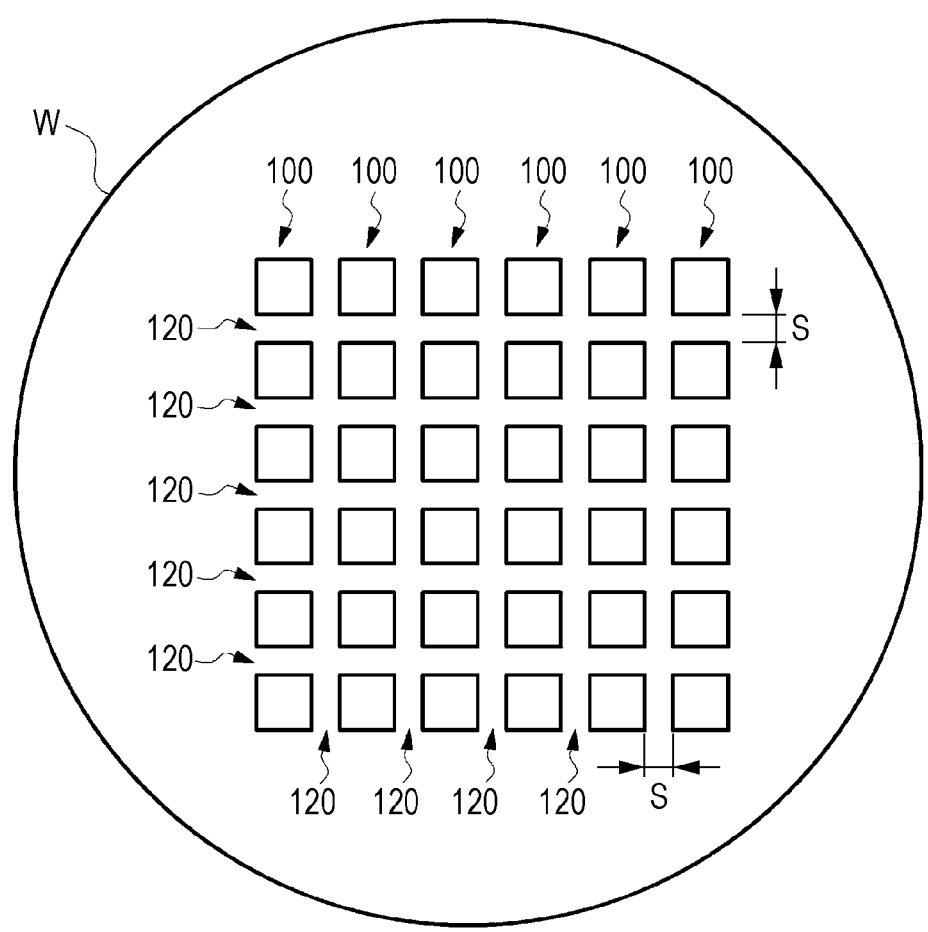
FIG. 4 is a schematic plan view of a semiconductor substrate (wafer) at the completion of formation of circuits.

FIG. 4 is a plan view showing an example of the semiconductor substrate W at the completion of the step of forming light-emitting elements. For the sake of convenience, the drawing shows only the light-emitting elements 100 in a central portion. Plural light-emitting elements 100 are formed in row and column directions of an array on the surface of the semiconductor substrate W. Each of the light-emitting elements 100 has a substantially rectangular planar region, and the light-emitting elements 100 are separated from each other in a lattice shape by cutting regions 120 defined by scribe lines having a predetermined space S.

Figure 2B:
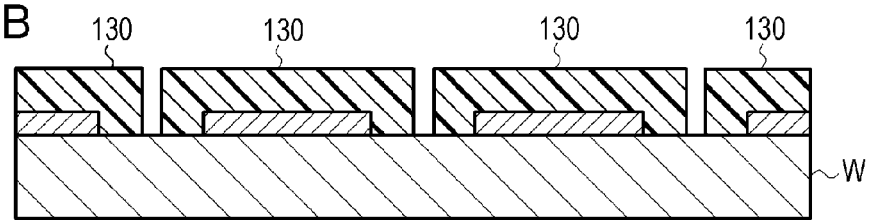

When the formation of the light-emitting elements is completed, next, a resist pattern is formed on the front surface of the semiconductor substrate W (S102). As shown in FIG. 2B, the resist pattern 130 is processed so as to expose the cutting regions 120 defined by the scribe lines on the surface of the semiconductor substrate W. The resist pattern 130 is processed by a photolithographic process.

Figure 2C:
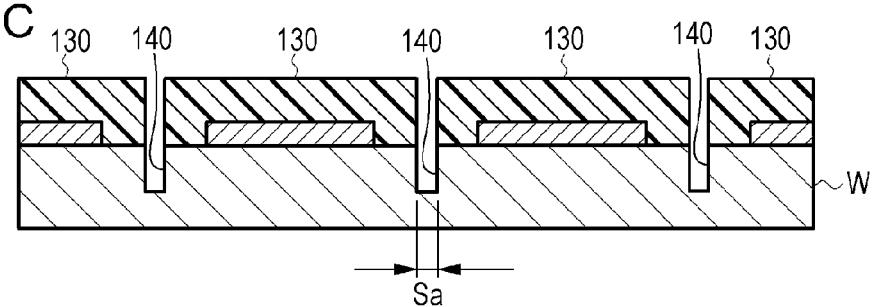

Next, fine grooves are formed in the surface of the semiconductor substrate W (S104). As shown in FIG. 2C, fine grooves (hereinafter referred to as "fine grooves" or "front-side grooves") 140 with a predetermined depth can be formed in the surface of the semiconductor substrate W by using the resist pattern 130 as a mask. The grooves can be formed by anisotropic dry etching, for example, anisotropic plasma etching (reactive ion etching). The grooves may be formed by using a thin dicing blade, isotropic etching, or the like, but narrow and deep grooves can be formed by anisotropic dry etching as compared with front-side grooves formed by isotropic etching. Also, the influences of vibration, stress, and the like on the light-emitting elements 100 around the fine grooves are more suppressed than in the use of a dicing blade. The width Sa of the fine grooves 140 is substantially the same as the width of apertures formed in the resist pattern 130, and is, for example, several μm to ten-odd μm. The depth of the fine grooves 140 is, for example, about 10 μm to 100 μm, and is deeper than the depth to which at least functional elements such as light-emitting elements are formed. When the fine grooves 140 are formed by a general dicing blade, the space S of the cutting regions 120 is increased to about 40 μm to 60 μm which is a total of the groove width formed by the dicing blade and a margin width in consideration of an amount of chipping. On the other hand, when the fine grooves 140 are formed by a semiconductor process, not only the grooves are narrower, but also the margin width for cutting is narrower than the margin width in the use of the dicing blade. That is, the space S of the cutting regions 120 is decreased, and thus the number of semiconductor chips taken out is increased by arranging, at a high density, light-emitting elements on a wafer. In the exemplary embodiment, the front side represents the surface side on which functional elements such as light-emitting elements are formed, and the back side represents the surface side opposite to the front side.

Figure 2D:
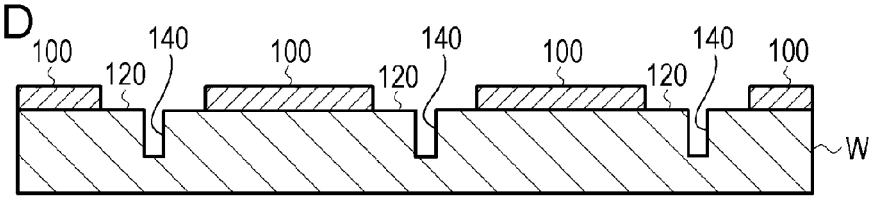

Next, the resist pattern 130 is separated (S106). As shown in FIG. 2D, when the resist pattern 130 is separated from the surface of the semiconductor substrate, the fine grooves 140 formed along the cutting regions 120 are exposed in the surface. The details of the shape of the fine grooves 140 are described below.

Figure 2E:
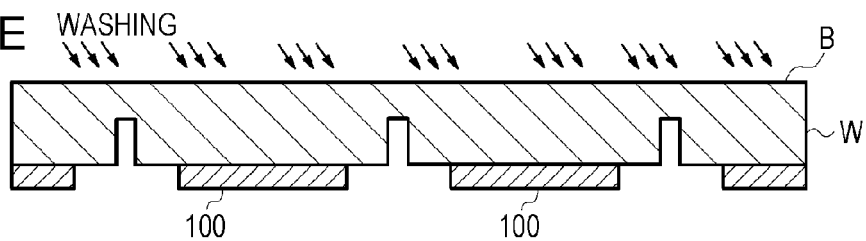

Next, the back surface of the semiconductor substrate is washed (S108). As shown in FIG. 2E, the back surface B of the substrate W is washed. The back surface is washed for enhancing uniformity of adhesion when an expand tape is attached to the back surface of the substrate in a subsequent step. A washing method uses dry washing such as ultraviolet (UV) ozone washing, plasma washing, or the like for removing organic contaminants adhering to the back surface of the semiconductor substrate. In addition, cutting chips during dicing may be removed by general water washing at least one of before and after dry washing. Washing of the back surface is described in detail below.

Figure 3A:
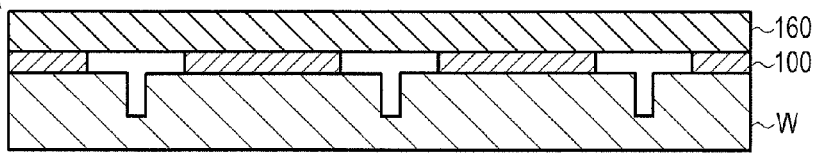
FIGS. 3A to 3E are schematic cross-sectional views of a semiconductor substrate in a process for manufacturing a semiconductor chip according to an exemplary embodiment of the present invention.

Next, an ultraviolet curable dicing tape is attached to the front surface of the substrate (S110). As shown in FIG. 3A, the dicing tape 160 having an adhesive layer is attached to the front side of the substrate on which light-emitting elements have been formed. The step of attaching the dicing tape is described in detail below.

Figure 3B:
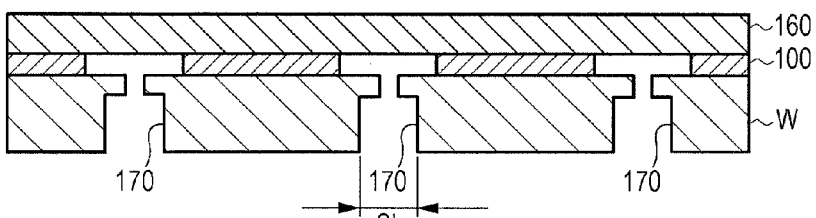

Next, half dicing is performed from the back surface side of the substrate toward the fine grooves 140 (S112). A cutting method of half dicing is not particularly limited, and, for example, a dicing blade, laser irradiation, or the like may be used. Here, an example using a dicing blade is described. The dicing blade can be positioned by a method in which an infrared camera is disposed on the back surface side of the substrate so that the fine grooves 140 are detected indirectly through the substrate, a method in which an infrared camera is disposed on the front surface side of the substrate so that the fine grooves 140 are detected directly, or another known method. The positioning allows half dicing to be performed by the dicing blade as shown in FIG. 3B, thereby forming grooves 170 in the back surface side of the semiconductor substrate.

Figure 5A:
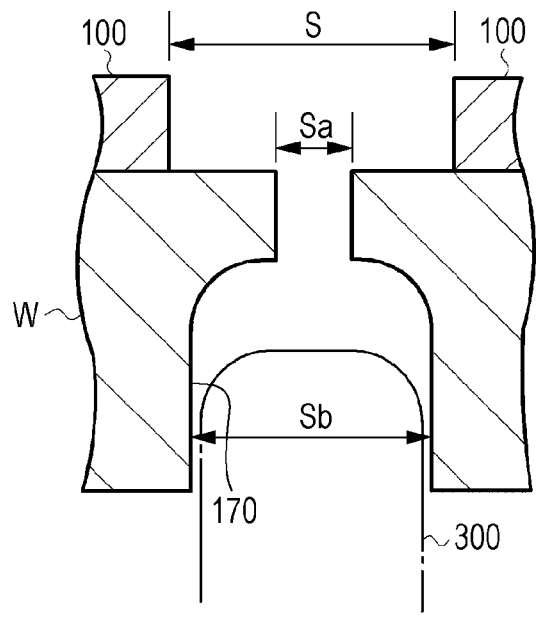
FIG. 5A is a cross-sectional view illustrating an example in which a back-side groove is formed to reach the depth of a fine groove by using a dicing blade.
Figure 5B:
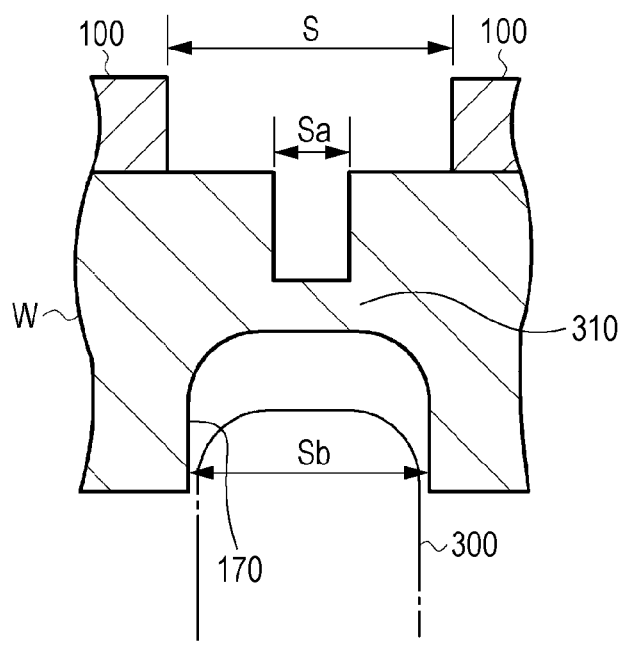
FIG. 5B is a cross-sectional view illustrating an example in which a back-side groove is formed not to reach a fine groove by using a dicing blade.

FIGS. 5A and 5B show examples of grooves formed on the back surface side by the dicing blade. The grooves 170 formed on the back surface side by the dicing blade 300 may have a depth reaching the fine grooves 140 formed in the front surface of the semiconductor substrate as shown in FIG. 5A or a depth not reaching the fine grooves 140 as shown in FIG. 5B. That is, when the distance of a portion 310 remaining between the fine grooves 140 and the grooves 170 on the back surface side is equal to or smaller than a certain value, the grooves 170 can be easily cut off from the fine grooves 140. The fine grooves 140 are formed with a width Sa narrower than the width Sb of the grooves 170 formed on the back surface side by the dicing blade. This is because when the fine grooves 140 are formed with a width narrower than the grooves 170 on the back surface side, the number of semiconductor chips which can be obtained from one wafer can be increased as compared with the case of cutting of the semiconductor substrate only by the dicing blade. If fine grooves of several μm to ten-odd μm shown in FIG. 2D can be formed to extend from the front surface to the back surface of the semiconductor substrate, grooves on the back surface side need not be formed by the dicing blade, but it is difficult to form the fine grooves with such a depth. Therefore, as shown in FIG. 3B, half dicing from the back surface with the dicing blade is combined with the fine grooves.

Figure 3C:
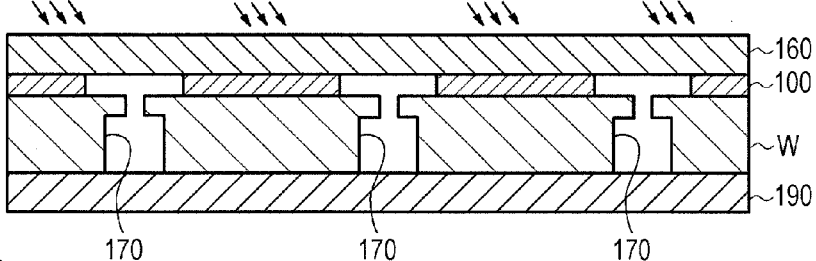

Next, the dicing tape is irradiated with ultraviolet light (UV), and the expand tape is attached (S114). As shown in FIG. 3C, the dicing tape 160 is irradiated with ultraviolet light 180 to cure the adhesive layer of the dicing tape 160. Then, the expand tape 190 is attached to the back surface of the semiconductor substrate.

Figure 3D:
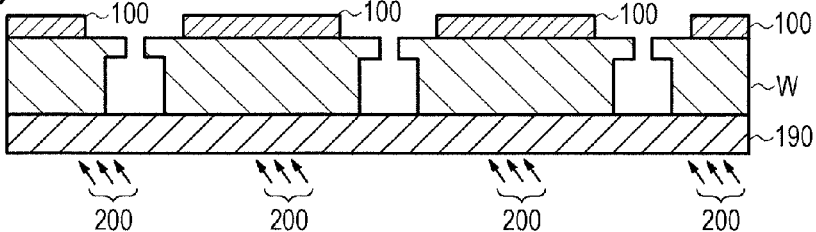

Next, the dicing tape is separated, and the expand tape 190 is irradiated with ultraviolet light (S116). As shown in FIG. 3D, the dicing tape 160 is separated from the surface of the semiconductor substrate. Also, the expand tape 190 on the back surface of the substrate is irradiated with ultraviolet light 200 to cure an adhesive layer of the expand tape 190. Next, the expand tape 190 is expanded (S118). The expand tape 190 is made of a base material having stretchability, and the tape 190 is expanded to increase the distance between the light-emitting elements so that the semiconductor chips divided after dicing can be easily picked up.

Figure 3E:
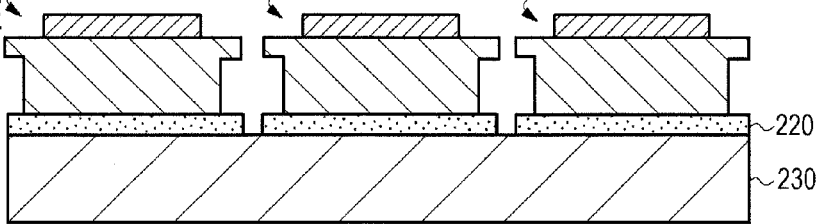

Next, the divided semiconductor chips are picked up and die-mounted (S120). As shown in FIG. 3E, semiconductor chips 210 picked up from the expand tape 190 are mounted on a circuit board 230 through a fixing member 220 such as conductive paste of an adhesive, solder, or the like. Although not shown in the drawing, a metal layer (gold electrode layer) functioning as a back-side electrode is provided over the entire surface on the back side of the semiconductor substrate W according to the exemplary embodiment. The back-side electrode is formed by, for example, vapor deposition or the like in a step before S100 or a step between S100 and S102 shown inn FIG. 1.

Next, washing of the back surface described in Step S108 is described in detail. After pre-treatment of the semiconductor substrate is completed, the back surface of the semiconductor substrate is washed. When the back surface is washed after half dicing from the back surface shown in Step S112, the semiconductor substrate is difficult to handle as one unit for washing because the semiconductor substrate is divided into individual semiconductor chips. When the back surface is washed after the dicing tape 160 is attached to the surface of the semiconductor substrate in Step S110, the dicing tape may deteriorate due to the washing step. Therefore, the back surface is washed before the dicing tape 160 is attached. On the other hand, the back surface can be washed during the step of pre-treatment of the semiconductor substrate. However, when another step is performed after the back surface is washed, the washed back surface is again contaminated. Therefore, washing of the back surface is performed after the completion of pre-treatment and before the start of post-treatment.

In one configuration of the exemplary embodiment, the back surface of the semiconductor substrate is washed by using a dry washing method. Examples of the dry washing method include a plasma washing method and an UV washing method. Although any one of the washing methods can be applied to washing of the back surface, an UV ozone washing method using a simple apparatus and having good workability is used.

In UV ozone washing, bonds of organic contaminants on the surface of the substrate are broken by irradiating the surface of the substrate with short-wavelength light energy of ultraviolet light. At the same time, active oxygen separated from ozone produced by ultraviolet light is chemically bonded to the organic contaminants and brings about reaction of decomposition into volatile substances such as carbon dioxide and water, thereby removing organic contaminants. UV ozone washing of the back surface of the semiconductor substrate makes cleanness of the back surface uniform and thus enhances uniformity of adhesion between the back surface of the substrate and the dicing tape subsequently attached.

Figure 6:
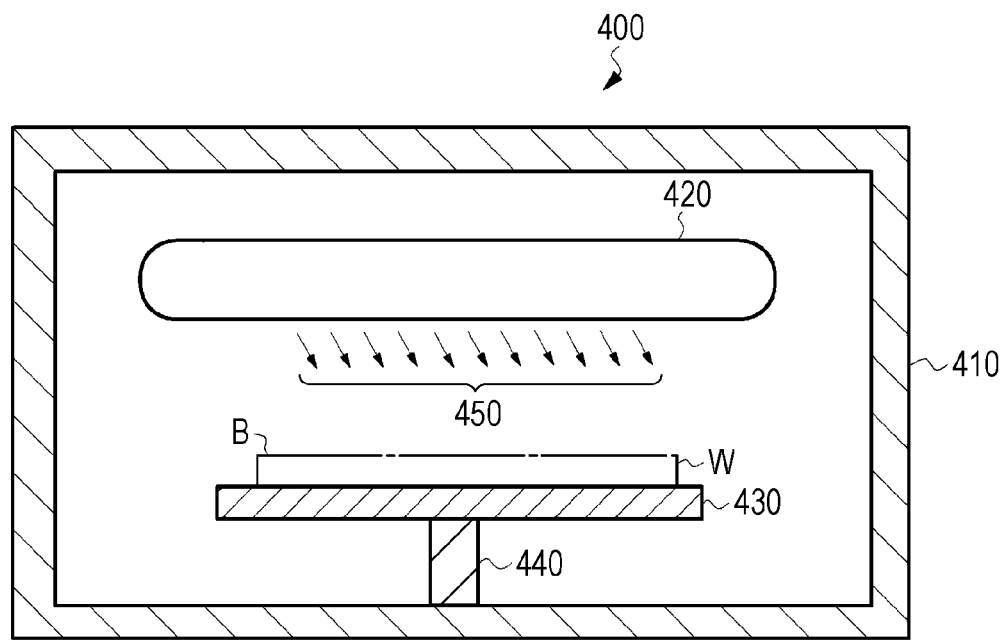
FIG. 6 is a schematic cross-sectional view illustrating a configuration of a UV ozone washing device.

FIG. 6 schematically shows a typical configuration of a sheet-type UV ozone washing device. A UV ozone washing device 400 includes a chamber 410, a lamp 420 disposed in the chamber 410, and a stage 430 disposed at a position facing the lamp 420. The lamp 420 includes, for example, a low-pressure mercury lamp or the like, and light at an ultraviolet wavelength is applied to the stage 430. Also, the stage 430 can be moved in the vertical direction by a height adjusting mechanism 440 so that the distance between the stage 430 and the lamp 420 can be changed.

Next, the operation in the UV ozone washing step is described with reference to a flow chart of FIG. 7. First, washing conditions for UV ozone washing are previously set (S200). The intensity of ultraviolet light irradiation by the lamp 420 is substantially constant, and thus irradiation (washing) energy of ultraviolet light for washing is adjusted by irradiation time×work distance. The work distance is the distance between the lamp 420 and the stage 430 or the distance between the lamp 420 and the substrate on the stage 430. An increase in irradiation energy represents a relative decrease in work distance and/or a relative increase in irradiation time and thus represents the enhancement of the ability of removing organic contaminants. In contrast, a decrease in irradiation energy represents a relative increase in work distance and/or a relative decrease in irradiation time and thus represents the weakening of the ability of removing organic contaminants. The washing conditions are stored in, for example, a memory or the like built in the UV ozone washing device, and a controller controls the irradiation time of the lamp 420 according to the washing conditions read from the memory. Also, the work distance can be set by the height adjustment mechanism 440, and this setting can be controlled by the controller. A method for determining the washing conditions set in S200 shown in FIG. 7 is described in detail below.

Next, a semiconductor substrate is transported into the chamber 410 by a transport mechanism (not shown) (S202), the semiconductor substrate is reversed so that the back surface of the substrate faces upward by a transport arm or the like, and placed on the stage 430 (S204). Next, an opening-closing door of the chamber 410 is closed, the lamp 420 is lighted on in a closed space of the chamber 410, and the back surface B of the substrate W is irradiated with ultraviolet light 450 (S206). The controller monitors whether or not the irradiation time set by the irradiation conditions is reached (S208), and when the irradiation time is reached, the lamp 420 is lighted off to finish washing of the back surface of the substrate (S210). When washing of the back surface is finished, the opening-closing door is opened, and the semiconductor substrate is taken out from the stage 430 (S212). The semiconductor substrate taken out is transported to a tape mounter on which next the dicing tape is attached. The UV ozone washing of the back surface of the substrate is performed using sheet as the unit.

In Step S114 which is a subsequent step, the expand tape is attached to the back surface of the substrate subjected to UV ozone washing (FIG. 3B). The expand tape includes a base material and an adhesive layer formed on a surface of the base material, and the adhesive layer is adhered to the back surface of the substrate. Since the back surface of the substrate is a surface uniformly cleaned by removing organic contaminants through UV ozone washing, the adhesive layer is uniformly bonded to the back surface of the substrate as compared with the case in which UV ozone washing is not performed, and thus uniformity of adhesion of the expand tape is enhanced.

Next, a flow chart of FIG. 8 showing another example of washing according to the exemplary embodiment is described. The steps from S200 to S212 are the same as those shown in FIG. 7 and are thus not described. In this example, it is determined whether or not uniformity of adhesion between the expand tape and the back surface of the substrate subjected to UV ozone washing satisfies a predetermined reference (S214), and UV ozone washing is repeated until uniformity satisfies the predetermined reference. When in step S214, it is determined that uniformity does not satisfy the predetermined reference, the controller sets the irradiation time of Δt (S216), and then the steps S202 to S212 are repeated. Again, it is determined whether or not uniformity satisfies the predetermined reference. The washing conditions to be first set in Step S200 of FIG. 8 may be different from those to be set in Step S200 of FIG. 7, and a condition in which it is unknown whether or not a defect due to uniformity of adhesion occurs may be set.

Figure 9A:
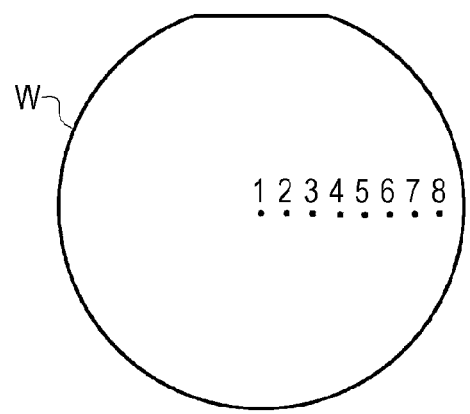
FIG. 9A is a drawing illustrating measurement positions of a contact angle.
Figure 9B:
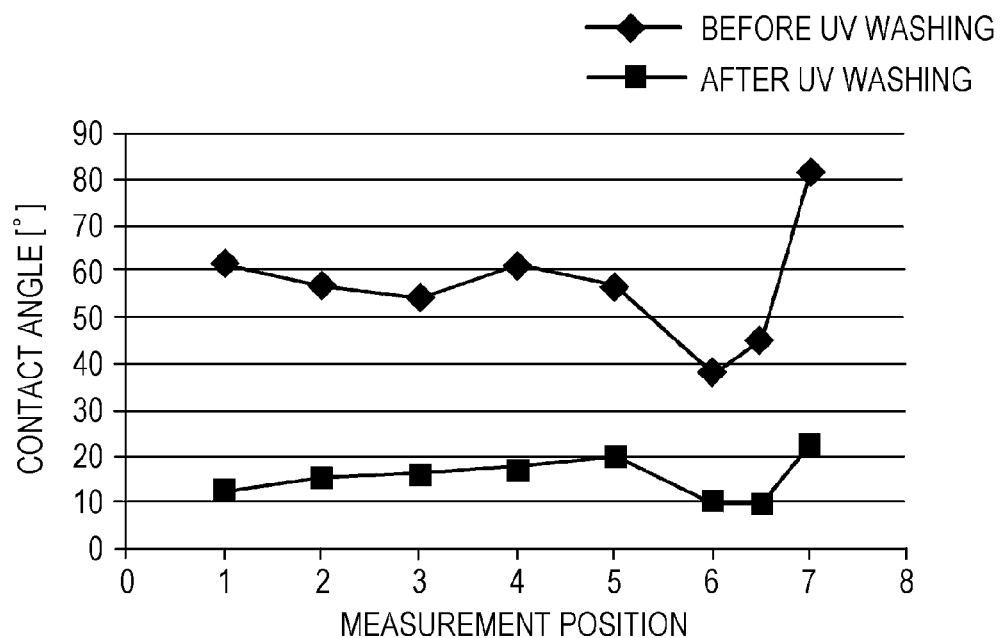
FIG. 9B is a graph showing contact angles at measurement positions before and after UV ozone washing.

Next, a method for determining uniformity is described. When organic contaminants are removed from a surface of the substrate, hydrophilicity of the surface of the substrate is improved. Improvement in hydrophilicity decreases surface energy and decreases the contact angle of a droplet dropped on the surface. Therefore, uniformity is determined by a contact angle method of measuring surface energy which indicates hydrophilicity. FIG. 9A shows measurement positions 1 to 8 on a substrate, and FIG. 9B shows the results of measurement of the contact angle before and after UV ozone washing, that is, the contact angle in a state where a defect due to uniformity of adhesion occurs and in a state where such a defect does not occur. The abscissa corresponds to the measurement positions 1 to 8 on the substrate, and the ordinate corresponds to the contact angle. The graph indicates that the contact angle after UV ozone washing is smaller than that before UV ozone washing. For example, according to the measurement results shown in the graph, the contact angle before UV ozone washing is about 38° or more, and the contact angle after UV ozone washing is about 25° or less. Also, the contact angle before UV ozone washing varies from about 38° to about 81°, and thus a variation width is about 43°. On the other hand, the contact angle after UV ozone washing varies from about 10° to about 22°, and thus a variation width is about 12° and is suppressed. That is, both cleanness and uniformity are improved. Therefore, for example, when the contact angle becomes smaller than 30° at all of the plural measurement positions, it can be determined that uniformity satisfies the predetermined reference. In other words, when the contact angle is smaller than the contact angle before UV ozone washing and is smaller than a predetermined angle, it can be determined that uniformity satisfies the predetermined reference. Also, when the variation width of contact angles at all of the plural measurement positions is smaller than 27°, it can be determined that uniformity satisfies the predetermined reference. In other words, when the variation width of the contact angle is smaller than the variation width of the contact angle before UV ozone washing and is smaller than a predetermined variation width, it can be determined that uniformity satisfies the predetermined reference.

Figure 10A:
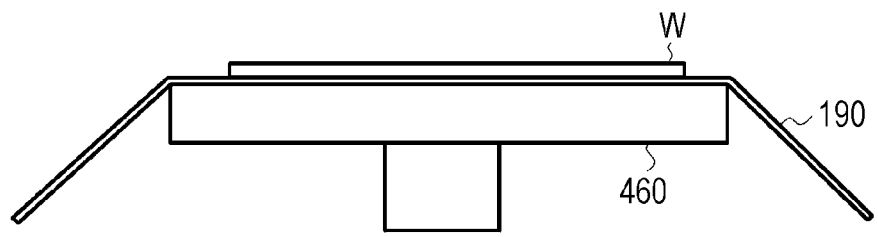
FIG. 10A is a drawing illustrating an expansion step.

Next, an expansion step (Step S118 in FIG. 1) is described. As described above, the expand tape 190 is attached to the back surface of the substrate subjected to UV ozone washing, and the expand tape 190 is expanded after irradiated with ultraviolet light. In the expansion step, for example, as shown in FIG. 10A, the expand tape 190 having the substrate W is placed on a stage 460. When the temperature of the stage 460 is gradually increased in a heating state, the expand tape 190 is stretched in the two-dimensional direction, and the distance between divided semiconductor chips on the tape 190 is extended.

Figure 10B:
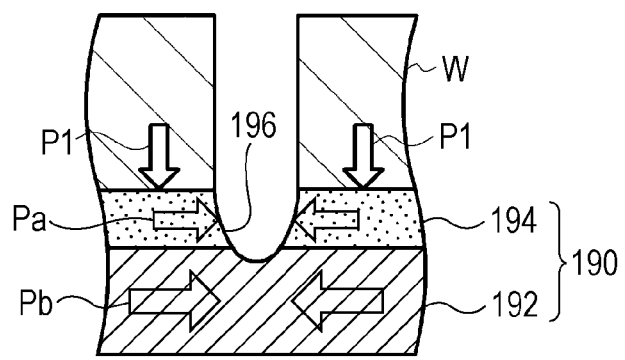
FIG. 10B is a drawing illustrating stress produced during expansion in the case of full dicing by a dicing blade from the front surface of a substrate.
Figure 10C:
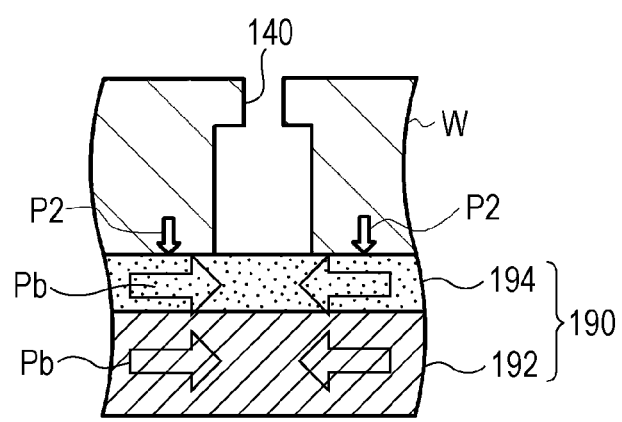
FIG. 10C is a drawing illustrating stress produced during expansion in the case of half dicing from the back surface of a substrate.

FIG. 10B is a drawing illustrating stress produced during expansion when a method of cutting (full dicing) the semiconductor substrate by a dicing blade is used. FIG. 10C is a drawing illustrating stress produced during expansion when a method of forming fine grooves in the front side of the substrate and half-dicing the substrate from the back surface by a dicing blade is used.

As shown in FIG. 10B, in the case of full-dicing from the front side of the substrate using the dicing blade, the expand tape 190 for holding the substrate and expanding is attached to the back surface of the substrate. The expand tape 190 includes a stretchable base material 192 and an adhesive layer 194 formed on a surface of the base material, and the adhesive layer 194 is adhered to the back surface of the substrate. After the expand tape 190 is attached, cutting is performed by the dicing blade from the front surface of the substrate along the cutting regions 120. The depth of cutting with the dicing blade is set, with a margin, to a position slightly deeper than the back surface of the substrate. Therefore, the substrate is completely cut into individual semiconductor chips. In addition, the cutting margin allows the expand tape 190 to be partially cut, and thus notches 196 with a certain depth are formed in the expand tap 190 so as to surround the peripheries of the semiconductor chips.

During expansion, tensile force Pb acts on the base material 192. In this case, the notches 196 have been formed in the expand tape 190, and thus the tensile force Pb of the base material is not entirely transmitted to the adhesive layer 194. That is, the tensile force Pa of the adhesive layer 194 is reduced by the notches 196 and is thus smaller than the tensile force Pb of the base material 192. On the other hand, during cutting by the dicing blade, in addition to the adhesive force of the adhesive layer 194, cutting pressure P1 is applied from the dicing blade, thereby strengthening the adhesive force between the adhesive layer 194 and the back surface of the substrate. Therefore, the back surfaces of the semiconductor chips are strongly bonded to the adhesive layer 194.

On the other hand, when the fine grooves 140 are formed in the front surface of the substrate and then half-dicing is performed from the back surface of the substrate using the dicing blade, the expand tape 190 is attached after half dicing, and thus cutting pressure is not applied to the dicing tape 190 from the dicing blade, thereby leaving adhesive force P2 of the adhesive layer 194 weak (P2<P1). Further, notches shown in FIG. 10B are not formed in the expand tape 190. Therefore, during expansion, the tensile force Pb acting on the base material 192 directly acts on the adhesive layer 194. Therefore, in the case of half dicing shown in FIG. 10C, in spite of the low adhesion of the adhesive layer 194, the tensile force Pb acting on the interface between the adhesive layer 194 and the back surface of the semiconductor chip is increased as compared with the case of full dicing shown in FIG. 10B.

Figure 11A:
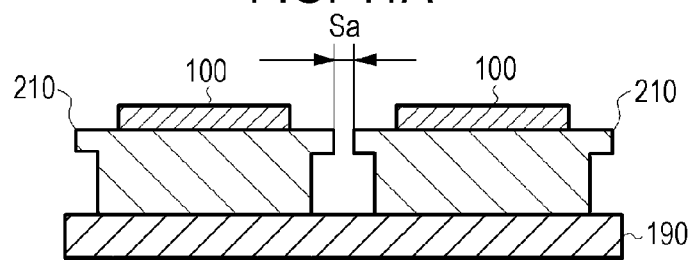
FIGS. 11A and 11B are drawings illustrating variation in adhesion between the back surfaces of semiconductor chips and an adhesive layer after expansion.
Figure 11B:
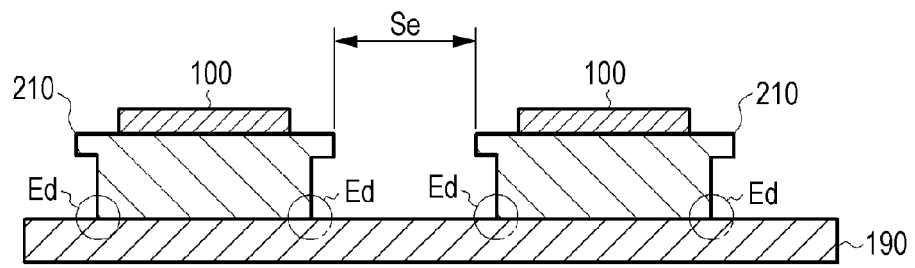

FIG. 11A shows a state before expansion when half dicing shown in FIG. 10C is performed, and FIG. 11B shows a state after expansion. As shown in FIG. 11A, the substrate is actually divided into individual semiconductor chips 210 by half dicing from the back surface. In this case, the distance between the semiconductor chips 210 equals to the width Sa of the fine grooves 140 formed in the front surface of the substrate, and, for example, when the fine grooves 140 are formed by anisotropic dry etching, the width Sa can be decreased to about 5 μm. As shown in FIG. 11B, when the expand tape 190 is expanded, the distance between the semiconductor chips 210 is extended to Se. In this state, the tensile force Pb acts on the interface between the back surfaces of the semiconductor chips 210 and the adhesive layer 194. However, when organic contaminants adhere to the back surface of the substrate of the semiconductor chip 210, the adhesion of the adhesive layer 194 deteriorates. Also, when organic contaminants non-uniformly adhere to the back surface of the substrate, variation occurs in the adhesion of the adhesive layer 194. In particular, adhesion of the adhesive layer 194 tends to decrease at edge portions Ed of the back surfaces of the semiconductor chips 210. The deterioration or variation in adhesion between the back surfaces of the semiconductor chips 210 and the adhesive layer 194 may cause a separation defect due to deviation of the distance Se between the semiconductor chips 210 from a proper value in the expansion step or may cause a trouble in separating individual semiconductor chips from the expand tape in a next picking step (Step S120 in FIG. 1).

Figure 12:
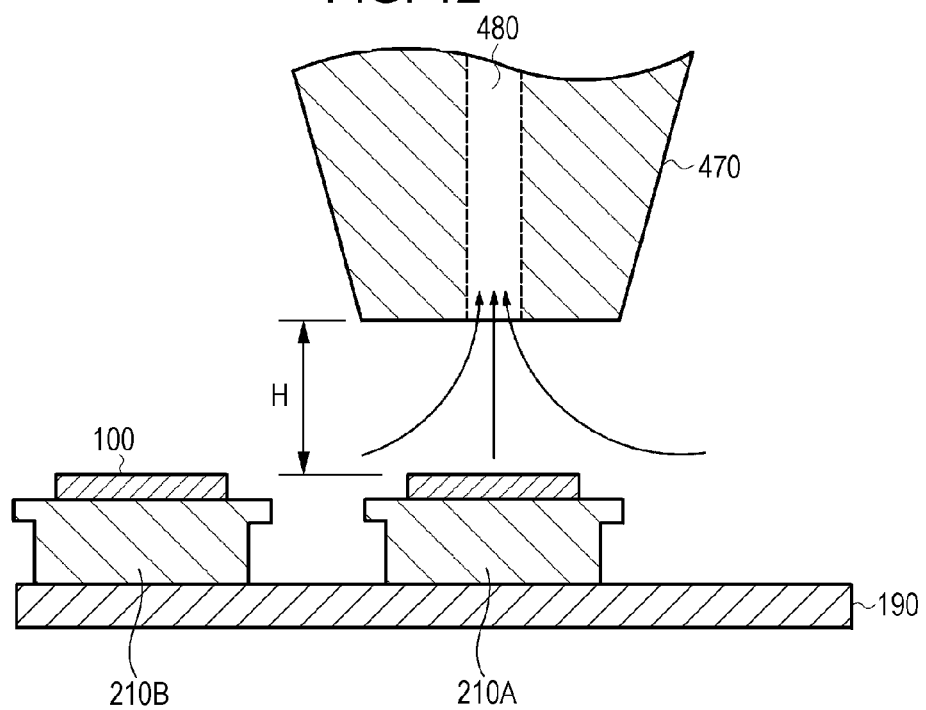
FIG. 12 is a drawing illustrating picking of semiconductor chips by a collet after expansion.

FIG. 12 is a drawing illustrating a step of picking up the semiconductor chips shown in FIG. 11B. In the picking step, the semiconductor chip 210 bonded to the expand tape is sucked by a collet 470 and is mounted on a circuit board or the like. As shown in FIG. 12, the typical collet 470 includes an inlet 480 formed at the center of a flat end portion to drawn in air so that the semiconductor chip 210 is sucked through the inlet 480. Since a light-emitting element and the like are formed on the surface of the semiconductor chip 210, the end portion of the collet 470 is positioned to be separated by a height H from the semiconductor chip 210, and the semiconductor chip 210 is sucked in a non-contact state. When the semiconductor chip 210A is sucked by the collet 470, weak adhesion of the adjacent semiconductor chip 210B or variation in adhesion may cause misregistration of the semiconductor chip 210B from the expand tape 190 or simultaneous sucking. When the position of the semiconductor chip 210B is displaced, the collet 470 may not correctly suck the semiconductor chip 210B, and if the semiconductor chip 210B can be sucked, the semiconductor chip 210B may not be correctly mounted on a circuit board or the like. The picking condition such as suction force is generally constant regardless of the position on the substrate, and in particular, large variation of adhesion with the position on the substrate causes difficulty in picking without the occurrence of the defect described above at all positions on the substrate. Also, when the fine grooves are formed in the front side of the substrate as shown in FIG. 10C, the distance between the semiconductor chips 210 is extended to Se which cannot be so much increased because of the small initial width Sa. In other words, even if the distance is extended to the same as in full dicing shown in FIG. 10B, the distance (Se) between the semiconductor chips 210 on the front surface of the substrate is narrower than that in full dicing. Therefore, the adjacent semiconductor chips are easily influenced by suction force of the collet 470 as compared with full dicing, and a defect due to uniformity of adhesion easily occurs. Further, as described above, when the extended distance Se between the semiconductor chips is made non-uniform due to nonuniformity of adhesion to the adhesive layer in the expansion step, the collet 470 is made difficult to correctly position with respect to the semiconductor chips, thereby causing a suction defect or defective mounting on a circuit board or the like.

In the exemplary embodiment, the grooves formed on the front surface side of the substrate are fine grooves, and thus deterioration in adhesion between the semiconductor chips 210 and the adhesive layer is suppressed by washing the back surface of the substrate, thereby enhancing uniformity of adhesion. This prevents the positions of the adjacent semiconductor chips from being displaced by suction force of the collet 470, and thus removes a problem during picking. Further, the distance between the semiconductor chips can be extended to the proper distance Se in the expansion step, and the collet 470 can be correctly positioned with respect to the semiconductor chips. As a result, each of the semiconductor chips can be securely mounted on a circuit board or the like, thereby improving yield of the process for manufacturing semiconductor chips.

Figure 13:
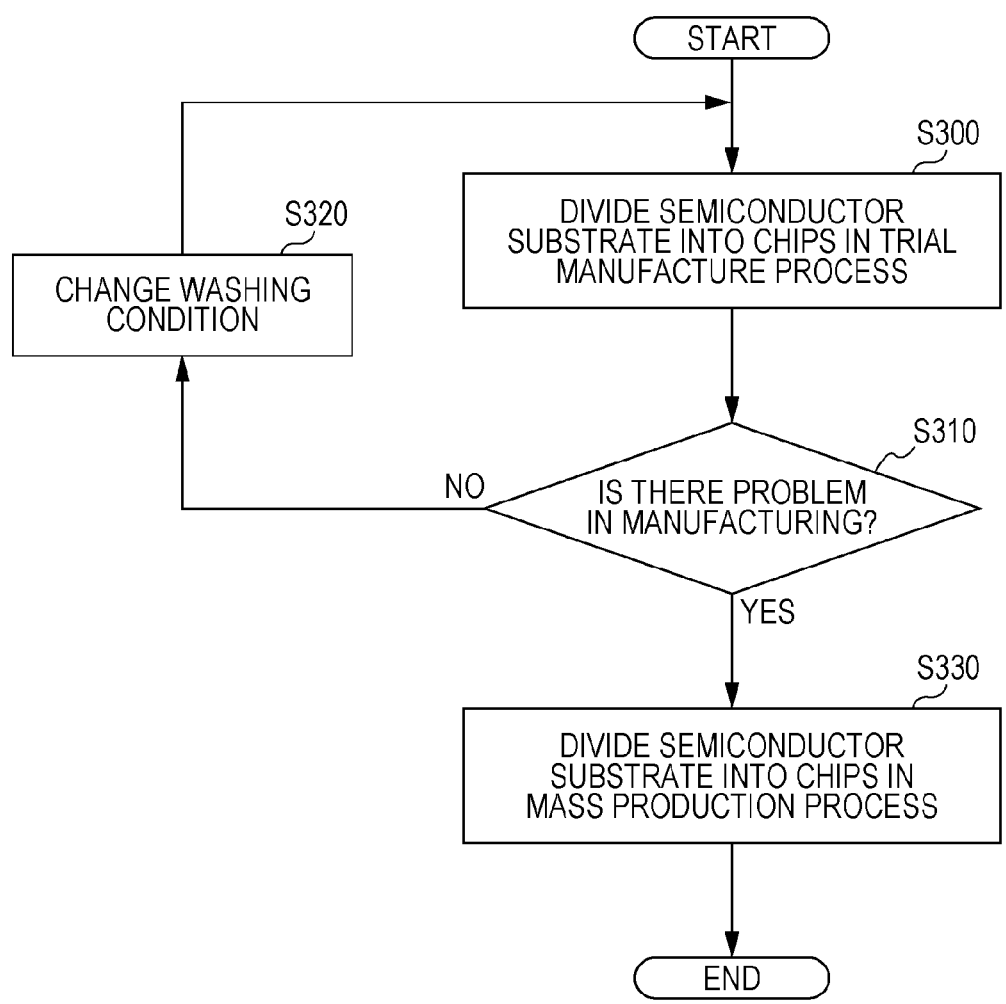
FIG. 13 is a flow chart illustrating a method for determining washing conditions according to an exemplary embodiment of the present invention.

Next, an example of a method for determining the washing conditions to be set in Step S200 in FIG. 7 is described. FIG. 13 is a flow chart showing a method for determining the washing conditions to be set in Step S200 in FIG. 7. First, in a trial manufacturing process, a semiconductor substrate is divided into chips according to the flow shown in FIG. 1 (S300). Next, it is determined whether or not there is a problem in manufacturing (S310). Specifically, determination is made on the occurrence of a defect, such as a separation defect in the expansion step, a suction defect in the picking step, a mount defect in the mounting step, or the like, which is caused by uniformity of adhesion between the back surface and the expand tape. This determination is based on whether or not the defect is allowable in a mass production process. When it is determined that there is no problem, the washing conditions (treatment conditions) are used as washing conditions in the mass production process (S330). That is, the washing conditions are set in Step S200 in FIG. 7. If it is determined that there is a problem, the washing conditions for the back surface are changed (S320).

In S320, a parameter of the washing conditions for washing the back surface in Step S108 in FIG. 1 is changed so as to improve uniformity of adhesion between the semiconductor substrate and the expand tape. For example, the irradiation time of UV ozone washing is increased or the work distance is decreased. When the irradiation time of UV ozone washing is increased and/or the work distance is decreased, the irradiation energy for washing is increased, and thus organic contaminants adhering to the back surface of the substrate are easily removed, thereby improving cleanness (decreasing the contact angle shown in FIG. 9) and improving uniformity.

After the washing conditions are changed in S320, the semiconductor substrate is again divided into chips in the trial manufacturing process (S300). Then, whether or not there is a problem in the manufacturing process is again determined (S310). When there is a problem, the steps from S300 to S320 are repeated until the problem does not occur. When it is determined in S310 that there is no problem, the washing conditions are used as conditions in the mass production process (S330). That is, the conditions are set as washing conditions in Step S200 in FIG. 7.

Although, in the exemplary embodiment, UV ozone washing of the back surface of the substrate is performed for enhancing uniformity of adhesion between the back surfaces of the semiconductor chips and the adhesive layer, washing is not limited to UV ozone washing as long as organic contaminants can be removed, and another dry washing method may be used. For example, plasma washing, ion washing, sputter washing, heat washing, dry ice spray washing, or the like can be applied to washing of the back surface of the substrate in the exemplary embodiment.

Although, in the exemplary embodiment, organic contaminants are removed for enhancing uniformity of adhesion between the back surfaces of the semiconductor chips and the adhesive layer, a method other than removal of organic contaminants may be used as long as uniformity can be enhanced.

The configuration of a UV ozone washing device shown in FIG. 6 is only an example, and a tabletop conveyor-type photo-modifying apparatus or the like other than this can be used. Further, in the exemplary embodiment, the back surface of the semiconductor substrate is washed using sheet as the unit, but batch treatment may be used. For example, batch treatment is performed by immersing plural semiconductor substrates in a washing liquid.

Also, in the exemplary embodiment, the expand tape is used as an example of the holding member to be attached to the back surface of the semiconductor substrate. However, any holding member may be used as long as it has the same function as the expand tape and, for example, it includes a base material having flexibility and a pressure-sensitive adhesive layer or an adhesive layer formed on the surface of the base material. The holding member is not limited to the tape, and for example, a sheet-shaped member such as a resin, a film, or the like may be used. Further, the pressure-sensitive adhesive layer or adhesive layer bonded to the substrate may be an ultraviolet curable material or an epoxy resin which is not an ultraviolet curable material.

Next, a modified example of the fine grooves formed on the front side of the substrate is described. The fine grooves shown in FIG. 2D are straight grooves formed by anisotropic dry etching so as to have side surfaces extending substantially vertically from the front surface of the substrate, but the fine grooves may have other shapes.

Figure 14A:
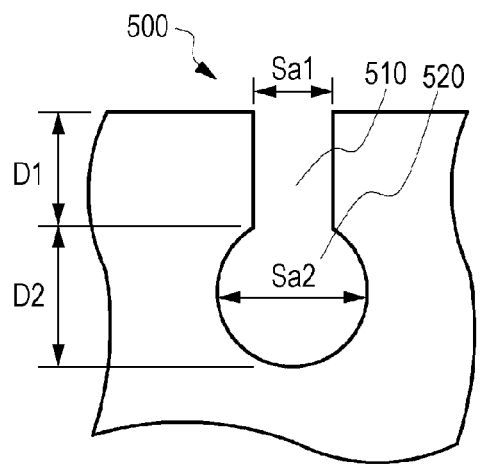
FIGS. 14A to 14D are cross-sectional views showing typical configurations of fine grooves according to an exemplary embodiment of the present invention.

FIGS. 14A, B, C, and D show other examples of configurations of the fine grooves according to the exemplary embodiment. A fine groove 500 shown in FIG. 14A has a first groove portion 510 having straight side surfaces formed with a depth D1 and a substantially uniform width Sa1, and a second groove portion 520 connected below the first groove portion 510 and having a depth D2 and spherical side surface and bottom. The width Sa2 of the second groove portion 520 corresponds to the inner diameter of the side surface in a direction parallel to the surface of the substrate, and satisfies the relation Sa2>Sa1. In the example shown in FIG. 14A, the width Sa2 is maximum near the center of the second groove portion 520.

A fine groove 500A shown in FIG. 14B has a first groove portion 510 having straight side surfaces formed with a depth D1 and a substantially uniform width Sa1, and a rectangular second groove portion 530 connected below the first groove portion 510 and having a depth D2 and substantially straight side surfaces. In the second groove portion 530, the spherical side surface and bottom of the second groove portion 520 shown in FIG. 14A are changed to straight surfaces, and the width Sa2 of the second groove portion 530 corresponds to the distance between side walls facing in a direction parallel to the surface of the substrate, which distance is substantially constant (Sa2>Sa1). The shape of the second groove portion shown in the drawing is an example, and the shape of the second groove portion may be any shape as long as it has a wider width than the width Sa1 of the first groove portion. For example, the second groove portion may have an intermediate shape between the second groove portion 520 shown in FIG. 14A and the second groove portion 530 shown in FIG. 14B, that is, an elliptical shape. In other words, the second groove portion may have a shape having a space with a width wider than the width of the groove (with of the groove at the depth D1) at the interface with the first groove portion.

A fine groove 500B shown in FIG. 14C has a first groove portion 510 having side surfaces formed with a depth D1 and a substantially uniform width Sa1, and a reverse-tapered second groove portion 540 connected below the first groove portion 510 and having a depth D2. The side surfaces of the second groove portion 540 are inclined so that the width gradually increases toward the bottom. The width Sa2 of the second groove portion 540 corresponds to the distance between the wide walls facing in a direction parallel to the surface of the substrate, the distance being maximum near the bottom (near the lower end) of the second groove portion 540.

Figure 14B:
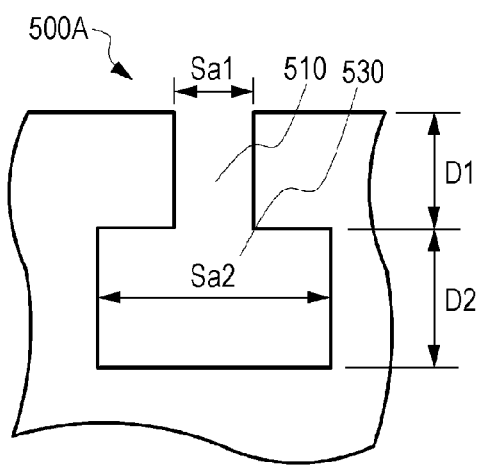
Figure 14C:
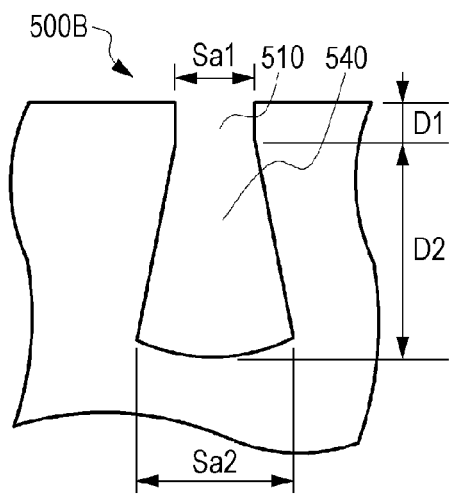
Figure 14D:
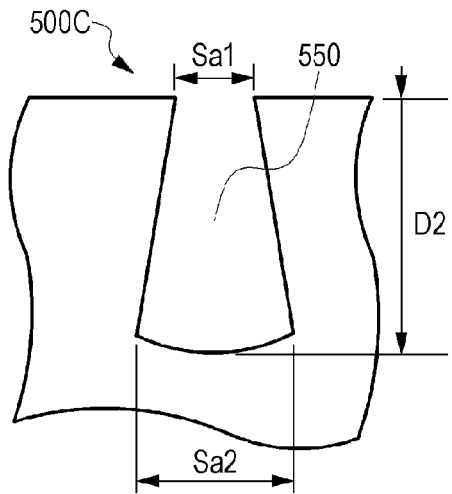

A fine groove 500C shown in FIG. 14D has a shape in which the width gradually increases from the aperture width Sa1 in the surface of the substrate to the width Sa2 near the bottom. That is, the fine groove 500C is a reverse-tapered groove having a depth D2. In the fine groove 500C, the depth D1 of the first groove portion 510 shown in FIG. 14C is extremely decreased. The shape shown in FIG. 14D is a shape in which comparing the upper and lower portions of the entire groove, the lower portion has a wider width, not a shape in which the angle of the side surface changes at the interface between the first groove portion and the second groove portion as shown in FIGS. 14A to 14C. The shape shown in FIG. 14D has a first groove portion (upper portion) and a second groove portion (lower portion) having a width wider than the first groove portion.

In order to suppress residue of the adhesive layer of the dicing tape when the dicing tape is separated, the first groove portion having a vertical shape shown in FIGS. 14A to 14C is more desired than the groove having a shape (reverse-tapered shape) in which the width gradually increases from the front surface to the back surface of the substrate as shown in FIG. 14D. This is because the reverse-tapered shape is a shape in which the adhesive layer entering the groove is less irradiated with ultraviolet light and thus the adhesive layer is less cured. Even when the adhesive layer is cured, stress is more applied to the root portions of the adhesive layer entering the groove than in the vertical shape during separation, thereby easily causing tear.

Further, from the viewpoint of suppressing residue of the adhesive layer, the shape of the side surfaces of the first groove portion is desirably a shape (forward-tapered shape) in which the width gradually decreases from the front surface to the back surface of the substrate rather than a vertical shape shown in FIGS. 14A to 14C. That is, the first groove portion desirably has a shape not having a portion (reverse-tapered shape) in which the width gradually increases from the front surface to the back surface of the substrate.

The fine grooves 500, 500A, 500B, and 500C shown in FIGS. 14A to 14D are formed in line symmetry with respect to a center line perpendicular to the substrate. FIGS. 14A to 14D each show the fine groove by straight lines or curved surfaces in order to make the characteristics of the fine groove easy to understand, but it is noted that the side surfaces of an actual fine groove may include a step or irregularity, and the corners are not necessarily formed in an angular shape and may be formed with a curved surface. Also, FIGS. 14A to 14D each show merely an example of the shape of the fine groove, and the shape may be another shape as long as it has a first groove portion and a second groove portion communicating the first groove portion and formed below the first groove portion to have a width wider than the first width. For example, a shape formed by combining the shapes shown in FIGS. 14A to 14D or a shape formed by combining the shapes shown in FIGS. 14A to 14D and further modifying the combined shape may be used. In addition, the angle of the reverse-mesa shape shown in FIGS. 14C and 14D is merely an example, and the shape may have inclination from a surface perpendicular to the surface of the substrate with any desired degree of inclination.

Figure 15:
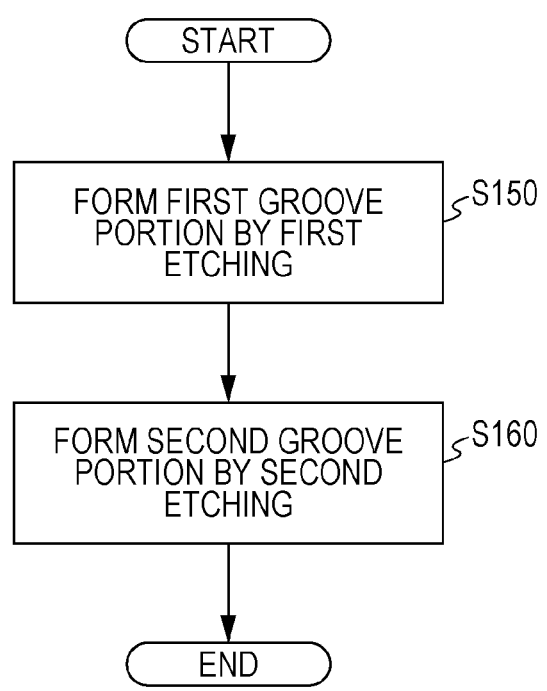
FIG. 15 is a flow chart illustrating a method for forming a fine groove according to an exemplary embodiment of the present invention.

Next, a method for forming the fine grooves according to the exemplary embodiment is described. FIG. 15 is a flow chart showing a method for forming the fine grooves according to the exemplary embodiment. A method for forming the fine grooves shown in FIGS. 14A to 14D includes a step (S150) of forming the first groove portion having the width Sa1 by first etching and a next step (S160) of forming the second groove portion below the first groove portion to have the width Sa2 wider than the width Sa1 by second etching. The second etching has higher etching strength than in the first etching in the direction to the side wall. An example using anisotropic etching as the first etching and isotropic etching as the second etching is described.

Figure 16A:
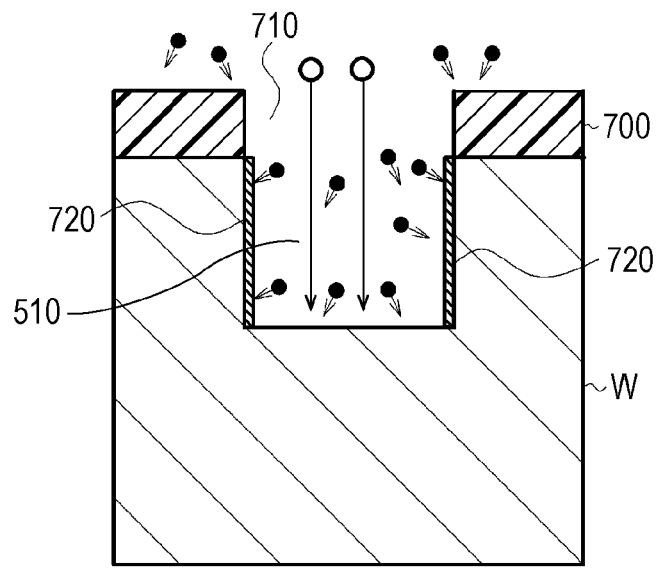
FIGS. 16A and 16B are schematic cross-sectional views in a step of forming a flask-shaped fine groove in a manufacturing method according to an exemplary embodiment of the present invention.
Figure 16B:
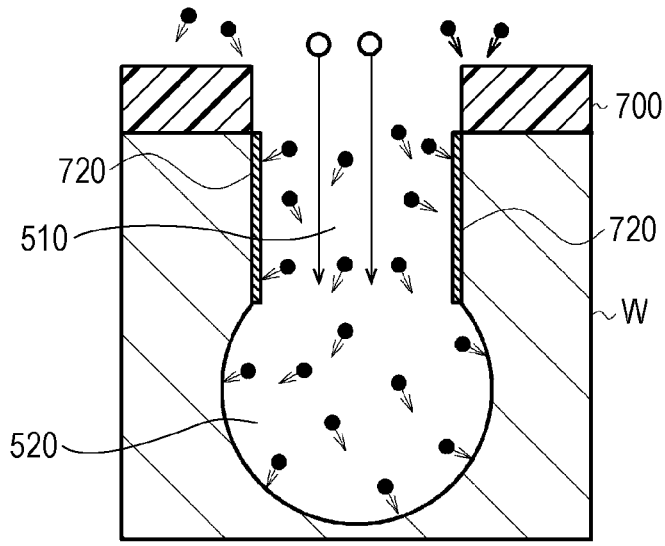

FIGS. 16A and 16B are schematic cross-sectional views illustrating the steps of forming the fine groove 500 shown in FIG. 14A. A photoresist 700 is formed on the front surface of the GaAs substrate W. The photoresist is, for example, i-line resist having a viscosity of 100 cpi and is applied to a thickness of about 8 μm. An aperture 710 is formed in the photoresist 700 by a known photolithographic process using, for example, an i-line stepper and a developer of 2.38% TMAH. The width of the aperture 710 defines the width Sa1 of the first groove portion.

The first groove portion 510 is formed in the surface of the substrate by anisotropic dry etching using the photoresist 700 as an etching mask. An inductively coupled plasma (ICP) is used as a reactive ion etching (RIE) apparatus. Examples of etching conditions include an inductively coupled plasma (ICP) power of 500 W, a bias power of 50 W, a pressure of 3 Pa, etching gases $Cl_2$ at 150 sccm, $BCl_3$ at 50 sccm, and $C_4F_8$ at 20 sccm, and an etching time of 20 minutes. As generally known, at the same time as etching a protective film 720 is formed by adding CF-based gas. In addition, radicals and ions are formed by reaction gas plasma. The side walls of the groove are attacked by only radicals, but are not etched because the protective film 720 is present. On the other hand, the protective film is removed from the bottom by ions vertically entering the groove, and a portion without the protective film is etched with radicals. Therefore, anisotropic etching is achieved.

Next, the etching conditions are changed to perform isotropic etching. As an example, the supply of $C_4F_8$ functioning to form the side wall protective film 720 is stopped. That is, the etching conditions include an inductively coupled plasma (ICP) power of 500 W, a bias power of 50 W, a pressure of 3 Pa, etching gases $Cl_2$ at 150 sccm and $BCl_3$ at 50 sccm, and an etching time of 10 minutes. Since the side wall protective film 720 is not formed by stopping the supply of $C_4F_8$, isotropic etching is achieved at the bottom of the first groove portion 510. As a result, the second groove portion 520 is formed below the first groove portion 510. The second groove portion 520 has the spherical side surface and bottom which extend in the lateral and downward direction from the first groove portion 500 with the width Sa1. The etching conditions described above are examples and may be appropriately changed according to the width, depth, and shape of the fine groove, and the like.

When the second groove portion of the shape shown in FIG. 14C is formed, the etching strength in the direction to the side wall may be weakened as compared with in formation of the second groove portion shown in FIG. 14A. The strength of etching toward the side wall can be changed by changing the etching condition such as the output of an etching apparatus, etching gas, or the like. Specifically, for example, the supply of $C_4F_8$ serving as a gas for the side wall protective film is not completely stopped and the flow rate of $C_4F_8$ is decreased as compared with the formation of the first groove portion, the flow rate of etching gas $Cl_2$ is increased, or these methods may be combined. In other words, the gas for both the side wall protective film and the etching gas contained in etching gas are supplied during both the formation of the first groove portion and the formation of the second groove portion, but the flow rate of each of the gases may be changed. When the flow rate of each of the gases is previously set before the first groove portion is formed, the first groove portion and the second groove portion can be formed by a series of continuous etching steps. When the first groove portion is formed in a shape (forward-tapered shape) in which the width gradually decreases from the front surface to the back surface of the substrate in order to suppress residue of the adhesive layer, the flow rates of $C_4F_8$ and $Cl_2$ or the output of the etching apparatus may be appropriately set or the flow rates may be changes so as to form the shape described above. The shape shown in FIG. 14D may be formed by omitting the formation of the first groove portion shown in FIG. 14C. Such etching may be generally achieved as isotropic etching.

Although the method for forming the fine grooves according to the exemplary embodiment is described, another method may be used as long as it can form the first groove portion and the second groove portion having a width wider than the first groove portion. For example, the fine grooves may be formed by combination of dry etching and wet etching. In addition, the first groove portion need not be formed only by first etching, and the second groove portion need not be formed only by second etching. That is, the first etching for the first groove portion may include other etching as long as the first etching is main etching, and the second etching for the second groove portion may include other etching as long as the second etching is main etching. In addition, for example, third and fourth groove portions may be present between the first groove portion and the second groove portion or at a position nearer to the back surface side of the substrate than the second groove portion. The third and fourth groove portions may be formed by third etching and fourth etching.

Although the exemplary embodiment of the invention is described above, the functions and structures disclosed in the exemplary embodiment may be combined within a range where the function and effect thereof are not impaired. Also, the present invention is not limited to a specified exemplary embodiment, and various deformations and modifications may be made within the scope of the gist of the present invention described in the following claims.

What is claimed is:

1. A method for manufacturing a semiconductor chip comprising:
    forming a front-side groove in a front surface of a substrate;
    forming a back-side groove wider than the front-side groove by a rotating cutting member from the back surface of the substrate toward the front-side groove;
    attaching a holding member having an adhesive layer to the back surface of the substrate after forming the back-side groove;
    dry-washing the back surface before attaching the holding member to the back surface;
    extending the distance between adjacent semiconductor chips by expanding the holding member attached to the back surface; and
    separating the semiconductor chips at the extended distance therebetween from the holding member.

2. The method for manufacturing a semiconductor chip according to claim 1, wherein the dry washing is ultraviolet ozone washing of the back surface.

3. The method for manufacturing a semiconductor chip according to claim 1, wherein the dry washing is plasma washing of the back surface.

4. The method for manufacturing a semiconductor chip according to claim 1, wherein a treatment condition for the dry washing is strength that brings a uniformity state in which a defect due to uniformity of adhesion between the back surface and the holding member occurs into a uniformity state in which a defect does not occur in at least one of extension of the distance between adjacent semiconductor chips and separation of the semiconductor chips from the holding member.

5. The method for manufacturing a semiconductor chip according to claim 1, further comprising:
    attaching another holding member having an adhesive layer to the front surface after forming the front-side groove and before forming the back-side groove,
    wherein the dry washing is performed after the front-side groove is formed and before the other holding member is attached to the front surface.

6. The method for manufacturing a semiconductor chip according to claim 1, wherein the dry washing is performed after the back-side groove is formed and before the holding member is attached to the back surface.

7. The method for manufacturing a semiconductor chip according to claim 1, further comprising:
    washing the substrate by water washing,
    wherein the dry washing is performed apart from the washing of the substrate by water washing.

8. The method for manufacturing a semiconductor chip according to claim 1, further comprising:
    washing off cutting chips by water washing,
    wherein the dry washing is performed apart from the washing off of cutting chips.

9. The method for manufacturing a semiconductor chip according to claim 8, wherein the dry washing is performed after the washing off of cutting chips.

* * * * *